US008116484B2

(12) United States Patent
Tokiwa

(10) Patent No.: US 8,116,484 B2

(45) Date of Patent: Feb. 14, 2012

(54) SOUND OUTPUT DEVICE, CONTROL METHOD FOR SOUND OUTPUT DEVICE, AND INFORMATION STORAGE MEDIUM

(75) Inventor: Naoki Tokiwa, Tokyo (JP)

(73) Assignee: Sony Computer Entertainment Inc., Tokyo (JP)

( * ) Notice: Subject to any disclaimer, the term of this patent is extended or adjusted under 35 U.S.C. 154(b) by 1314 days.

(21) Appl. No.: 11/736,557

(22) Filed: Apr. 17, 2007

(65) Prior Publication Data

US 2008/0041219 A1 Feb. 21, 2008

(30) Foreign Application Priority Data

Jun. 27, 2006 (JP) ................................ 2006-176137

(51) Int. Cl.
*H03G 3/00* (2006.01)

(52) U.S. Cl. ......................................... 381/104; 700/94

(58) Field of Classification Search .................... 381/77, 381/104, 61, 63, 1, 103, 17–23, 106, 107, 381/109; 700/94; 84/1, 601, 602, 615, 622, 84/611, 610
See application file for complete search history.

(56) References Cited

U.S. PATENT DOCUMENTS

| | | | | |
|---|---|---|---|---|
| 6,901,148 | B2 * | 5/2005 | Yoshino et al. | 381/103 |
| 7,386,132 | B2 * | 6/2008 | Griesinger | 381/18 |
| 7,386,139 | B2 * | 6/2008 | Hashimoto et al. | 381/310 |
| 7,764,805 | B2 * | 7/2010 | Tomita et al. | 381/307 |

FOREIGN PATENT DOCUMENTS

| | | | |
|---|---|---|---|
| JP | 02-132493 | A | 5/1990 |
| JP | 03-254163 | A | 11/1991 |
| JP | 05-168098 | A | 7/1993 |
| JP | 06-215482 | A | 8/1994 |
| JP | 06-311581 | A | 11/1994 |
| JP | 10-084241 | A | 3/1998 |
| JP | 11-113098 | A | 4/1999 |
| JP | 2000-010756 | A | 1/2000 |
| JP | 2000-152396 | A | 5/2000 |
| JP | 2002-191100 | A | 7/2002 |
| JP | 2003-116200 | A | 4/2003 |
| JP | 2005-012534 | A | 1/2005 |
| JP | 2005-286903 | A | 10/2005 |

OTHER PUBLICATIONS

Japanese Patent Office, Notice of Rejection, issued in corresponding Japanese Application No. 2006-176137, dated Sep. 2, 2008, 5 pages, which includes a 1-page partial English language translation.
Japan Patent Office; "Notice of Rejection" issued in corresponding Japanese Application No. 2006-176137; dated May 27, 2008; 5 pages (includes 1 page partial English Translation).

* cited by examiner

*Primary Examiner* — Xu Mei
*Assistant Examiner* — Lao Lun-See
(74) *Attorney, Agent, or Firm* — Fitch, Even, Tabin & Flannery LLP

(57) ABSTRACT

To provide a sound output device capable of preferably outputting, while utilizing control data created based on an assumption that sound data will be output via a certain number of speakers, the sound data via a number of speakers that is larger or smaller than the certain number. The main control data storage unit stores main control data. The first sound output control unit outputs sound data from the one or more main speakers based on the main control data. The sub-control data storage unit stores sub-control data. The second sound output control unit outputs the sound data from the one or more sub-speakers based on the main control data and the sub-control data.

17 Claims, 9 Drawing Sheets

FIG.5

| SOUND DATA | SOUND VOLUME (v) | LEFT-RIGHT BALANCE (a) | PITCH |
|---|---|---|---|
| SOUND EFFECT A | 1500 | 64 | 44100 |
| SOUND EFFECT B | 1000 | 100 | 22050 |
| SOUND EFFECT C | 800 | 0 | 36000 |
| SOUND EFFECT D | 2200 | 127 | 8000 |
| SOUND EFFECT E | 2000 | 32 | 16000 |

FIG.6

| | |
|---|---|
| FRONT-REAR BALANCE (b) | 80 |

| SOUND DATA | SOUND VOLUME (v) | LEFT-RIGHT BALANCE (a) | FRONT-REAR BALANCE (b) | PITCH |
|---|---|---|---|---|
| SOUND EFFECT A | 1500 | 64 | 50 | 44100 |
| SOUND EFFECT B | 1000 | 100 | 127 | 22050 |
| SOUND EFFECT C | 800 | 0 | 110 | 36000 |
| SOUND EFFECT D | 2200 | 127 | 64 | 8000 |
| SOUND EFFECT E | 2000 | 32 | 0 | 16000 |

| | |
|---|---|
| STAND-BY TIME | 0.009 SECONDS |

SOUND OUTPUT DEVICE, CONTROL METHOD FOR SOUND OUTPUT DEVICE, AND INFORMATION STORAGE MEDIUM

CROSS REFERENCE TO RELATED APPLICATION

The present application claims priority from Japanese Application No. 2006-176137, filed Jun. 27, 2006, the disclosure of which is hereby incorporated by reference herein in its entirety.

BACKGROUND OF THE INVENTION

1. Field of the Invention

The present invention relates to a sound output device, a control method for the sound output device, and an information storage medium.

2. Description of the Related Art

Most users conventionally enjoy a game while outputting sound effects, or the like, of the game via a two-channel speaker. However a multi-channel speaker (for example, a speaker more than two channels, such as the 5.1 channel speaker system) has recently become common. As a multi-channel speaker can impart a sense of presence to the game sound effects, or the like, an increasing number of users are starting to utilize a multi-channel speaker when enjoying a game.

Here, to output sound effects, or the like, of a game, according to a commonly applied method, a game sound creator creates control data for sound output which describes, in a predetermined data format, a parameter value, such as a sound volume, frequency, sound volume balance, or the like, of each sound effect, or the like, and the game program interprets the control data and outputs the sound effect or the like.

When a user enjoying a game using a two-channel speaker and a user enjoying a game using a multi-channel speaker coexist, the game sound creator is required to make a game sound effect output, or the like, so as to be adapted to two-channel sound output and multi-channel sound output (for example, sound output via more than two channels, such as a 5.1 channel sound output, or the like) so that the respective users can preferably enjoy the game sound effect, or the like. As a result, the game sound creator is required to create control data adapted to the respective sound outputs.

For example, in order to make it possible to enjoy a game that was created when only use of a two-channel speaker was expected, that is, a game for which only control data adapted to two-channel sound output is prepared, while using a multi-channel speaker, the creator is required to newly create control data adapted to multi-channel sound output.

Further, for example, in creating a new game, the game sound creator is required to create control data adapted to two-channel sound output and the multi-channel sound output. This results in a burden imposed on the game sound creator that is not insignificant.

In connection with the above, it will be possible to reduce the burden imposed on the game sound creator, or the like, such as is described above, if it becomes possible to preferably output the sound data using control data, which is created based on the assumption that the sound data will be output via a certain number of speakers, via a number of speakers that is either larger or smaller than the assumed certain number. For example, even when attempting to enjoy a game for which only control data adapted to two-channel sound output is prepared, using a multi-channel speaker, new creation of control data adapted to multi-channel sound output is unnecessary. Further, in creating a new game, creation of control data adapted to both of the two-channel sound output and the multi-channel sound output is unnecessary.

The present invention has been conceived in view of the above, and an object thereof is to provide a sound output device, a control method for the sound output device, and an information storage medium capable of preferable output of sound data, while using control data created based on an assumption that the sound data will be output via a certain number of speakers, via a number of speakers that is larger or smaller than the expected certain number.

SUMMARY OF THE INVENTION

In order to solve the above described problems, according to one aspect of the present invention, there is provided a sound output device, comprising main control data storage for storing main control data; first sound output control means for outputting sound data from one or more main speakers based on the main control data stored in the main control data storage; sub-control data storage for storing sub-control data; and second sound output control means for outputting the sound data from one or more sub-speakers based on the main control data stored in the main control data storage and the sub-control data stored in the sub-control data storage.

According to another aspect of the present invention, there is provided a control method for a sound output device, comprising a main control data reading step of reading, from main control data storage for storing main control data, the main control data; a first sound output control step of outputting sound data from one or more main speakers based on the main control data read at the main control data reading step; a sub-control data reading step of reading, from sub-control data storage for storing sub-control data, the sub-control data; and a second sound output control step of outputting the sound data from one or more sub-speakers based on the main control data read at the main control data reading step and the sub-control data read at the sub-control data reading step.

According to yet another aspect of the present invention, there is provided a program for causing a computer to function as main control data reading means for reading, from main control data storage for storing main control data, the main control data; first sound output control means for outputting sound data from one or more main speakers based on the main control data read by the main control data reading means; sub-control data reading means for reading, from sub-control data storage for storing sub-control data, the sub-control data; and second sound output control means for outputting the sound data from one or more sub-speakers based on the main control data read by the main control data reading means and the sub-control data read by the sub-control data reading means.

An information storage medium according to the present invention is a computer readable information storage medium storing the above-described program.

In the present invention, main control data for outputting sound data from one or more main speakers is stored. Then, based on the main control data, the sound data is output via the one or more main speakers. Also, sub-control data for outputting sound data from one or more sub-speakers using the main control data is stored. Then, based on the main control data and the sub-control data, the sound data is output via the one or more sub-speakers. According to the present invention, it is possible to preferably output sound data, while utilizing control data (main control data) that has been created based on the assumption that the sound data will be output via a certain number of speakers, via a number of speakers that is larger than the certain number.

In the above, the main control data may contain first sound volume balance data relevant to output sound volume balance in outputting the sound data from the plurality of the main speakers, the sub-control data may contain second sound volume balance data relevant to output sound volume balance between the main speaker and the sub-speaker, and the second sound output control means may include sound volume determination means for determining output sound volume of the sub-speaker based on the first sound volume balance data and the second sound volume balance data.

In the above, the sound output device may further comprise means for guiding a user to set the sub-control data, wherein the sub-control data storage may store the sub-control data set by the user.

According to yet another aspect of the present invention, there is provided a sound output device, comprising control data storage for storing control data for outputting sound data from one or more main speakers and one or more sub-speakers; acquisition mean for acquiring main control information corresponding to the main speaker and sub-control information corresponding to the sub-speaker based on the control data; first sound output control means for outputting object sound data from a speaker serving as the main speaker based on the main control information in response to arrival of a sound output timing; and second sound output control means for outputting sound data formed by shifting a phase of the object sound data from the speaker serving as the main speaker based on the sub-control information in response to arrival of the sound output timing.

According to yet another aspect of the present invention, there is provided a control method for a sound output device, comprising a control data reading step of reading, from control data storage for storing control data for outputting sound data from one or more main speakers and one or more sub-speakers, the control data; an acquisition step of acquiring main control information corresponding to the main speaker and sub-control information corresponding to the sub-speaker based on the control data; a first sound output control step of outputting object sound data from a speaker serving as the main speaker based on the main control information in response to arrival of a sound output timing; and a second sound output control step of outputting sound data formed by shifting a phase of the object sound data from a speaker serving as the main speaker based on the sub-control information in response to arrival of the sound output timing.

According to yet another aspect of the present invention, there is provided a program for causing a computer to function as control data reading means for reading, from control data storage for storing control data for outputting sound data from one or more main speakers and one or more sub-speakers, the control data; acquisition means for acquiring main control information corresponding to the main speaker and sub-control information corresponding to the sub-speaker based on the control data; first sound output control means for outputting object sound data from a speaker serving as the main speaker based on the main control information in response to arrival of a sound output timing; and second sound output control means for outputting sound data formed by shifting a phase of the object sound data from a speaker serving as the main speaker based on the sub-control information in response to arrival of the sound output timing.

An information storage medium according to the present invention is a computer readable information storage medium storing the above-described program.

According to the present invention, control data for outputting sound data from one or more main speakers and one or more sub-speakers is stored. Also, based on the control data, main control information corresponding to the main speaker and sub-control information corresponding to the sub-speaker are obtained. Then, upon arrival of the sound output timing, the object sound data is output from the speaker serving as the main speaker, based on the main control information. In addition, upon arrival of the sound output timing, sound data formed by shifting the phase of the object sound data is output from the speaker serving as the main speaker, based on the sub-control information. According to the present invention, while using control data created based on the assumption that sound data will be output via a certain number of speakers, preferable output of sound data via a number of speakers that is smaller than the certain number is achieved.

In the above, the sound data formed by shifting the phase of the object sound data may be sound data formed by substantially inverting the phase of the object sound data.

In the above, the control data may include sound volume balance data concerning output sound volume balance between the main speaker and the sub-speaker, the acquisition means may acquire an output sound volume corresponding to the main speaker and an output sound volume corresponding to the sub-speaker based on the sound volume balance data, the first sound output control means may output the object sound data from the speaker serving as the main speaker at the output sound volume corresponding to the main speaker, and the second sound output control means may output the sound data formed by shifting the phase of the object sound data from the speaker serving as the main speaker at the output sound volume corresponding to the sub-speaker.

In the above, a timing at which to begin output of the sound data formed by shifting the phase of the object sound data may be defined different from a timing at which to begin output of the object sound data.

In the above, the sound output device may further comprise stand-by time storage for storing a stand-by time, wherein the second sound output control means may include stand-by means for holding output of the sound data formed by shifting the phase of the object sound data in a stand-by state, based on the stand-by time stored in the stand-by time storage.

In the above, the stand-by means may include means for monitoring whether or not the stand-by time stored in the stand-by time storage elapses after output of the object sound data by the first sound output control means begins, and beginning output of the sound data formed by shifting the phase of the object sound data when the stand-by time stored in the stand-by time storage elapses after the output of the object sound data by the first sound output control means begins.

In the above, the stand-by time may be determined based on a distance between the speaker serving as the main speaker and the speaker serving as the sub-speaker based on an assumption that the speaker serving as the main speaker and the speaker serving as the sub-speaker are set.

In the above, the sound output device may further comprise means for guiding a user to set the stand-by time, wherein the stand-by time storage may store the stand-by time set by the user.

BRIEF DESCRIPTION OF THE DRAWINGS

FIG. 5 is a diagram showing one example of two-channel sound output parameter data;

FIG. 6 is a diagram showing one example of a front-rear balance parameter;

DESCRIPTION OF THE PREFERRED EMBODIMENTS

In the following, embodiments of the present invention will be described with reference to the accompanying drawings. Here, an example will be described in which the present invention is applied to an entertainment system (a sound output device) which functions as a game device for executing a game, a music reproduction device for reproducing music, a video reproduction device for reproducing video, or the like.

1. First Embodiment

Figure 1:
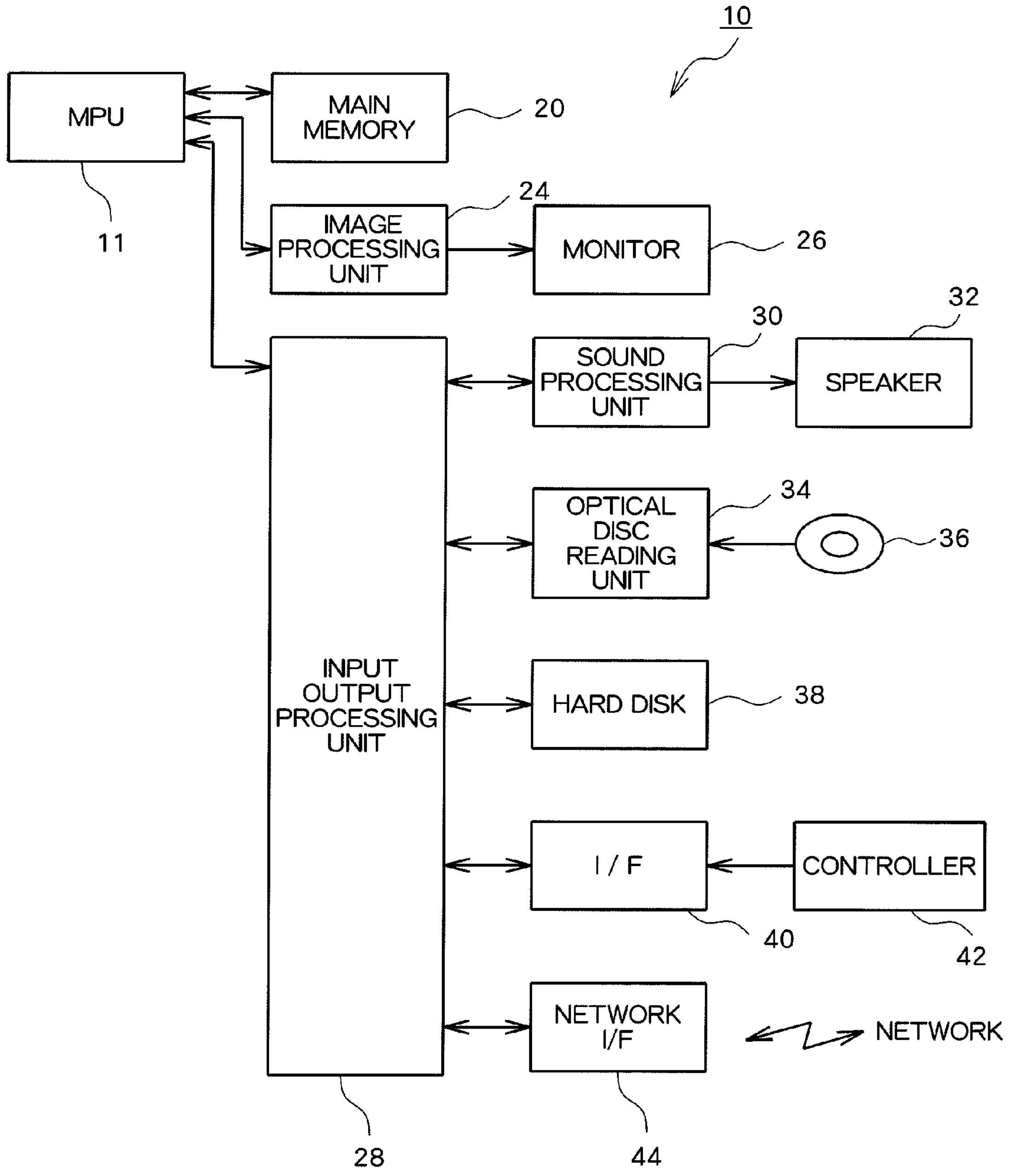
FIG. 1 is a diagram showing a hardware structure of an entertainment system according to first and second embodiments of the present invention.

FIG. 1 is a diagram showing a hardware structure of an entertainment system according to a first embodiment of the present invention. As shown in FIG. 1, an entertainment system 10 is a computer system constructed comprising an MPU (Micro Processing Unit) 11, a main memory 20, an image processing unit 24, a monitor 26, an input output processing unit 28, a sound processing unit 30, a speaker 32, an optical disc reading unit 34, an optical disc 36, a hard disk 38, an interface (I/F) 40, a controller 42, and a network interface (I/F) 44.

Figure 2:
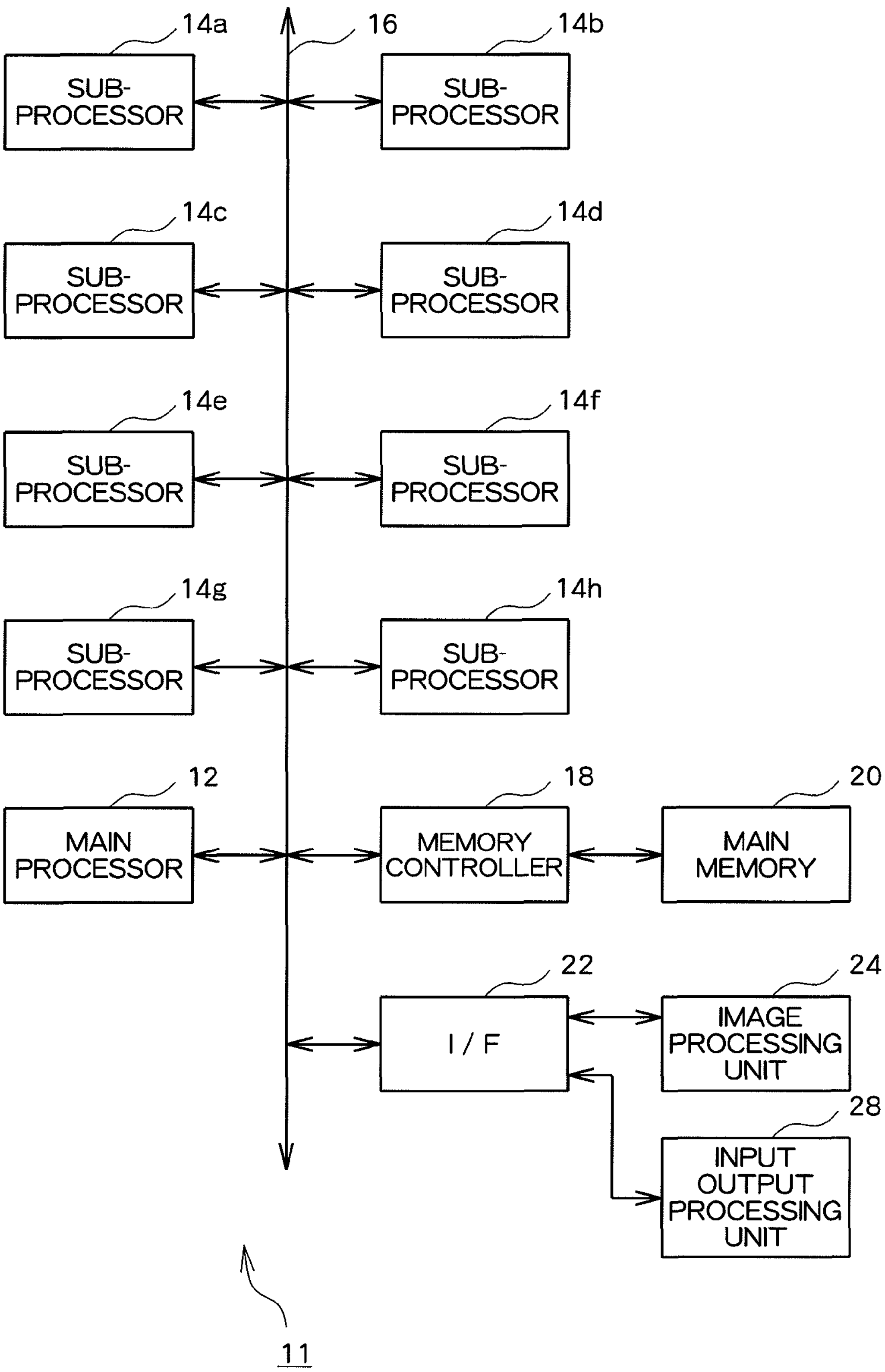
FIG. 2 is a diagram showing a structure of an MPU.

FIG. 2 is a diagram showing a structure of the MPU 11. As shown in FIG. 2, the MPU 11 is constructed comprising a main processor 12, sub-processors 14*a*, 14*b*, 14*c*, 14*d*, 14*e*, 14*f*, 14*g*, 14*h*, a bus 16, a memory controller 18, and an interface (I/F) 22.

The main processor 12 effects control of the sub-processors 14*a* to 14*h* based on an operating system stored in a ROM (Read Only Memory) (not shown), programs and data read from the optical disc 36, such as a DVD (Digital Versatile Disk)-ROM, or the like, for example, and programs and data, or the like, supplied from a network via a network interface 44.

The sub-processors 14*a* to 14*h* carry out various kinds of information processes according to an instruction sent from the main processor 12. For example, the sub-processors 14*a* to 14*h* control the respective sections of the entertainment system 10 based on a program and data read from the optical disc 36, such as a DVD-ROM, or the like, for example, and a program and data, or the like, supplied from a network via the network interface 44.

The bus 16 is used for exchanging an address and data among the respective sections of the entertainment system 10. The main processor 12, the sub-processors 14*a* to 14*h*, the memory controller 18, and the interface 22 are mutually connected via the bus 16 for data exchange.

The memory controller 18 accesses the main memory 20 according to instructions sent from the main processor 12 and the sub-processors 14*a* to 14*h*. Programs and data read from the optical disc 36 and/or the hard disk 38 and programs and data supplied from the network via the network interface 44 are written into the main memory 20 as required. The main memory 20 is used as a working memory of the main processor 12 and the sub-processors 14*a* to 14*h*.

The image processing unit 24 and the input output processing unit 28 are connected to the interface 22. Data exchange between the main processor 12 and the sub-processors 14*a* to 14*h* and the image processing unit 24 or the input output processing unit 28 is carried out via the interface 22.

The image processing unit 24 is constructed comprising a GPU (Graphical Processing Unit) and a frame buffer. The GPU renders various screen images into the frame buffer based on the image data supplied from the main processor 12 and the sub-processors 14*a* to 14*h*. The screen image rendered in the frame buffer is converted into a video signal at a predetermined timing before being output to the monitor 26. It should be noted that the monitor 26 may be, for example, a home-use television receiver.

The sound processing unit 30, the optical disc reading unit 34, the hard disk 38, the interface 40, and the network interface 44 are connected to the input output processing unit 28. The input output processing unit 28 controls data exchange between the main processor 12 and the sub-processors 14*a* to 14*h* and the sound processing unit 30, the optical disc reading unit 34, the hard disk 38, the interface 40, and the network interface 44.

The sound processing unit 30 is constructed comprising an SPU (Sound Processing Unit) and a sound buffer. The sound buffer stores various sound data, such as game music, game sound effects, and messages, read from the optical disc 36 and/or the hard disk 38. The SPU reproduces these various kinds of sound data and outputs via the speaker 32. It should be noted that the MPU 11, instead of the sound processing unit 30 (SPU), may reproduce various sound data and output via the speaker 32. That is, reproduction output of various kinds of sound data via the speaker 32 may be realized by means of software processing carried out by the MPU 11.

Figure 3:
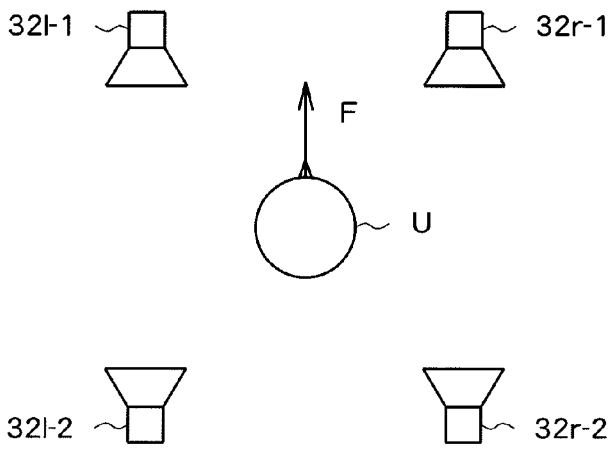
FIG. 3 is a diagram showing one example of layout of the speakers in the first embodiment.

The entertainment system 10 is constructed including four speakers 32 and capable of four-channel sound output. For example, as shown in FIG. 3, a front left speaker 321-1 is installed in front of and to the left of the user U (listener), and a front right speaker 32*r*-1 is installed in front of and to the right of the user U. In addition, a rear left speaker 321-2 is installed left behind the user U, and the rear right speaker 32*r*-2 is installed right behind the user U. It should be noted that the reference character F in FIG. 3 indicates the frontward direction relative to the user U (this is similarly applied to FIGS. 8 and 14 to be described later).

The optical disc reading unit 34 reads a program and data stored in the optical disc 36 according to an instruction sent from the main processor 12 and the sub-processors 14*a* to 14*h*. The optical disc 36 is a typical optical disc, such as a DVD-ROM, or the like, for example. The hard disk 38 is a typical hard disk device. The optical disc 36 and the hard disk 38 store various programs and data so as to be read by a computer. It should be noted that the entertainment system 10 may be constructed capable of reading a program and data stored in an information storage medium other than the optical disc 36 and the hard disk 38.

The interface 40 is an interface for connection to various kinds of peripheral devices, such as a controller 42, or the like. As such an interface, a Bluetooth (trademark) interface for radio connection to various peripheral devices, a USB (Universal Serial Bus) interface for wired connection to various peripheral devices, for example, may be used. The controller 42 is a general purpose operation input device, and is used by a user to input various kinds of operations (for example, game operation).

The network interface 44 is connected to the input output processing unit 28 and a network, and relays data communication by the entertainment system 10 via the network to another entertainment system 10.

In the thus constructed entertainment system 10, for example, a game program, sound data, such as game sound effects, or the like, and control parameter data for outputting various sound data in the manner of two-channel sound output (hereinafter referred to as two-channel sound output parameter data) are read from the optical disc 36 or the hard disk 38, and a game is carried out.

It should be noted that two-channel sound output parameter data (main control data) is control parameter data created based on the assumption that, for example, sound data is output via two speakers 32 (main speakers), including the speaker 32 installed to the front left of the user and the speaker 32 installed to the front right of the user.

In the following, a technique for preferably outputting sound data via four speakers 32, including a front left speaker **32*l*-1, a front right speaker 32*r*-1 (main speakers), a rear left speaker 32*l*-2, and a rear right speaker 32*r*-2** (sub-speakers), using two-channel sound output parameter data will be described. That is, a technique for preferably carrying out four-channel sound output utilizing two-channel sound output parameter data will be described.

Figure 4:
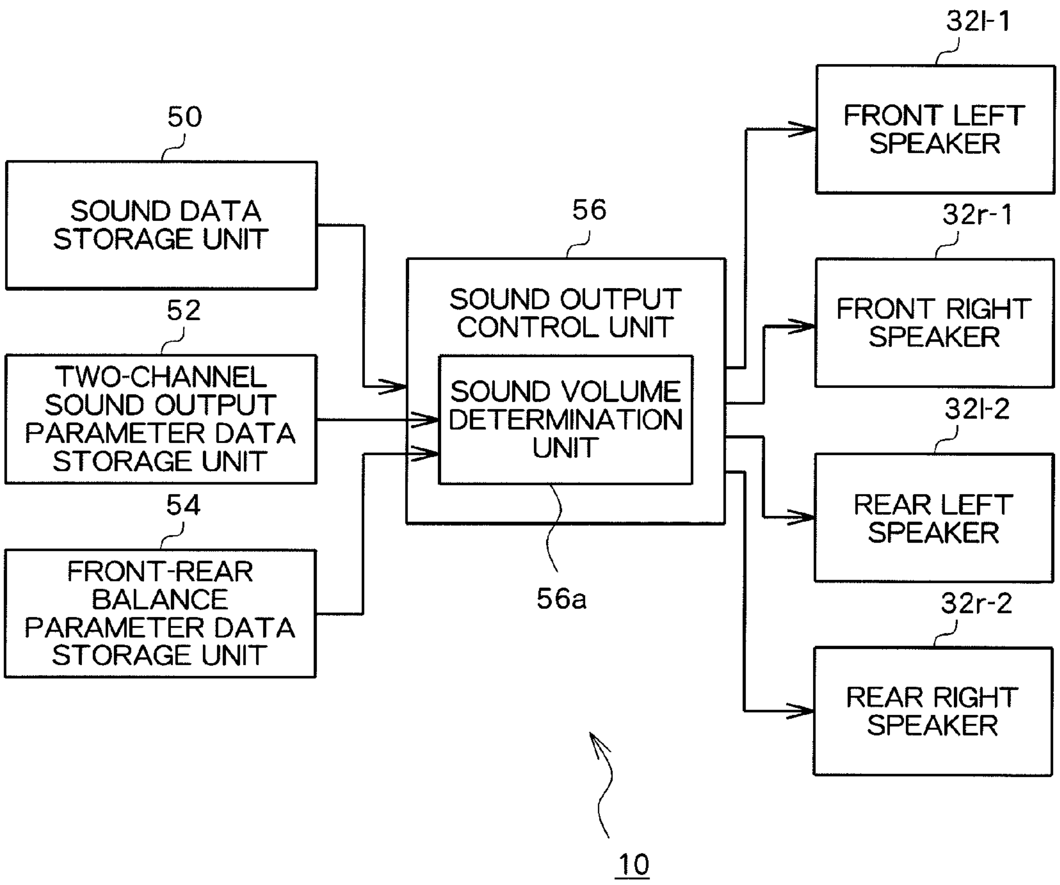
FIG. 4 is a functional block diagram of an entertainment system according to the first embodiment.

FIG. 4 is a diagram showing mainly the functional blocks relevant to the present invention among those realized by the entertainment system 10. As shown in FIG. 4, the entertainment system 10 is constructed comprising a sound data storage unit 50, a two-channel sound output parameter data storage unit 52 (a main control data storage means), a front-rear balance parameter data storage section 54 (a sub-control data storage means), and a sound output control section 56 (a first sound output control means, a second sound output control means). These functional blocks are realized by the MPU 11 by executing, for example, programs read from the optical disc 36 and/or the hard disk 38 or programs supplied from the network via the network interface 44.

[Sound Data Storage Unit]

The sound data storage unit 50 is realized, for example, using the optical disc 36 and/or the hard disk 38. The sound data storage unit 50 stores, for example, sound data, such as game sound effects, or the like. In this embodiment, waveform data which describes the waveform of a sound signal is stored as sound data.

[Two-Channel Sound Output Parameter Data Storage Unit]

The two-channel sound output parameter data storage unit 52 is realized by, for example, the optical disc 36 and/or the hard disk 38. Two-channel sound output parameter data is stored in the two-channel sound output parameter data storage unit 52.

FIG. 5 is a diagram showing one example of two-channel sound output parameter data. As shown in FIG. 5, the two-channel sound output parameter data includes, for each sound data, a sound volume parameter, a left-right balance parameter, and a pitch parameter. Here, the sound volume parameter indicates an output sound volume, and a pitch parameter indicates a pitch.

A left-right balance parameter concerns balance of output sound volumes between the speaker 32 (the left speaker) installed in front of (or behind) and to the left of the user and the speaker 32 (the right speaker) installed in front of (or behind) and to the right of the user.

In this embodiment, specifically, the left-right balance parameter takes numeric values from 0 to 127. For a left-right balance parameter of 64, the volumes of the sounds output via the left and right speakers become equal to each other. For a left-right balance parameter smaller than 64, the volume of the sound output via the left speaker is larger than the volume of the sound output via the right speaker. For a left-right balance parameter larger than 64, the volume of the sound output via the right speaker is larger than the volume of the sound output via the left speaker.

Here, the manner of determining the volume of sounds output via the respective speakers (the left and right speakers) when two-channel sound output is carried out based on two-channel sound output parameter data will be described.

When two-channel sound output is carried out based on two-channel sound output parameter data, the sound volume vl of the left speaker and the sound volume vr of the right speaker are determined using the expressions (1) to (6) below in which "v" represents a sound volume parameter of output object sound data, and "a" represents a left-right balance parameter of output object sound data. In this specification, "*" is a multiplication operator, and "/" is a division operator.

For the left-right balance parameter of the output object sound data being 64, the sound volume vl of the left speaker and the sound volume vr of the right speaker are expressed by the expressions (1) and (2). In this case, the sound volume vl of the left speaker becomes equal to the sound volume vr of the right speaker.

$$vl=v \quad (1)$$

$$vr=v \quad (2)$$

For the left-right balance parameter of the output object sound data being smaller than 64, the sound volume vl of the left speaker and the sound volume vr of the right speaker are expressed by the expressions (3) and (4). In this case, the sound volume vl of the left speaker becomes larger than the sound volume vr of the right speaker. When the value of the left-right balance parameter becomes smaller while the sound volume vl of the left speaker remains constant, the sound volume vr of the right speaker becomes smaller. Consequently, a larger difference results between the sound volume vl of the left speaker and the sound volume vr of the right speaker.

$$vl=v \quad (3)$$

$$vr=v*(a/64) \quad (4)$$

It should be noted that when the left-right balance parameter of the output object sound data is 0, the sound volume vl of the left speaker becomes v, and the sound volume vr of the right speaker becomes 0.

For the left-right balance parameter of the output object sound data being larger than 64, the sound volume vl of the left speaker and the sound volume vr of the right speaker are expressed by the expressions (5) and (6). In this case, the sound volume vr of the right speaker becomes larger than the sound volume vl of the left speaker. Also, when the value of the left-right balance parameter becomes larger while the sound volume vr of the right speaker remains constant, the sound volume vl of the left speaker becomes smaller. Consequently, a larger difference results between the sound volume vr of the right speaker and the sound volume vl of the left speaker.

$$vl=v*((127-a)/64) \tag{5}$$

$$vr=v \tag{6}$$

It should be noted that when the left-right balance parameter of the output object sound data is 127, the sound volume vl of the left speaker becomes 0, and the sound volume vr of the right speaker becomes v.

When two-channel sound output is carried out based on the two-channel sound output parameter data, sound data is output via the respective speakers 32 at the sound volume determined as described above for each of the speakers 32.

[Front-Rear Balance Parameter Data Storage Unit]

The front-rear balance parameter data storage unit 54 can be realized using, for example, the main memory 20, the optical disc 36, and the hard disk 38. The front-rear balance parameter data storage unit 54 stores data (sub-control data) describing a front-rear balance parameter. The front-rear balance parameter concerns a balance of output sound volumes between the speaker 32 (the front speaker) installed in front of the user and the speaker 32 (the rear speaker) installed behind the user. In this embodiment, the front-rear balance parameter presents numeric values from 0 to 127. FIG. 6 shows one example of the front-rear balance parameter data.

For a front-rear balance parameter of 64, the sound volumes of the front and rear speakers become equal to each other. For a front-rear balance parameter smaller than 64, the volume of the sound output via the front speaker becomes larger than the volume of the sound output via the rear speaker. For a front-rear balance parameter larger than 64, the volume of the sound output via the rear speaker becomes larger than the volume of the sound output via the front speaker. Details will be described later (see S103 through S107 in FIG. 7).

The front-rear balance parameter data is stored as data different from the two-channel sound output parameter data. For example, the front-rear balance parameter is set by a programmer, and held as a constant in the game program. Alternatively, the front-rear balance parameter may be set by the user. For example, a screen for guiding the user to set a value of the front-rear balance parameter may be shown on the monitor 26, so that the value of the front-rear balance parameter, which is set by the user is stored in the front-rear balance parameter data storage unit 54.

It should be noted that the front-rear balance parameter may be set either common to all sound data or set for each of the sound data.

[Sound Output Control Unit]

The sound output control unit 56 is formed using, as main elements, the MPU 11 and the sound processing unit 30. The sound output control unit 56 outputs sound data via the front left speaker 321-1, the front right speaker **32*r*-1, the rear left speaker 321-2, and the rear right speaker 32*r*-2**.

[Sound Volume Determination Unit]

The sound output control unit 56 contains a sound volume determination unit **56*a*. The sound volume determination unit 56*a* determines the sound volume at which sound data is output via the respective speakers 32**, based on the two-channel sound output parameter data and the front-rear balance parameter data.

Figure 7:
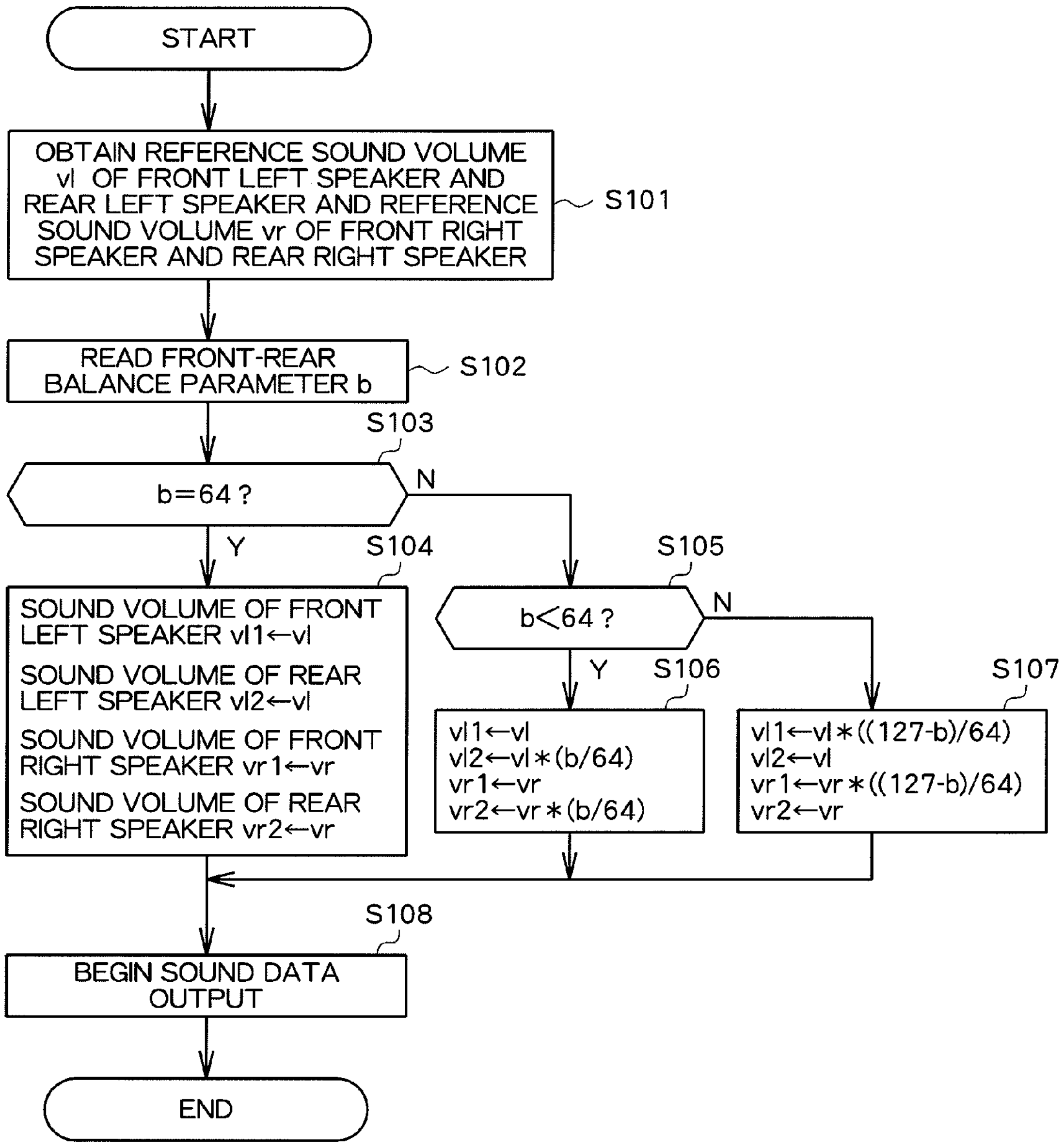
FIG. 7 is a flowchart of a process to be carried out by the entertainment system.

Here, a process to be carried out by the entertainment system 10 will be described. FIG. 7 is a flowchart showing mainly the processes relevant to the present invention among those to be executed to initiate output of sound data. The sound output control unit **56*a* is realized by the MPU 11** by executing a program to carry out this process.

As shown in FIG. 7, a reference sound volume vl for the front left speaker 321-1 and the rear left speaker 321-2, and a reference sound volume vr for the front right speaker **32*r*-1 and the rear right speaker 32*r*-2 are obtained (S101**). Here, it should be noted that the reference sound volume vl refers to the sound volume of the left speaker when two-channel sound output is carried out based on two-channel sound output parameter data, and the reference sound volume vr refers to the sound volume of the right speaker when two-channel sound output is carried out based on the two-channel sound output parameter data.

At this step, the sound volume parameter v and left-right balance parameter a of the output object sound data are read from the two-channel sound output parameter data, and the reference sound volumes vl, vr are obtained based on these parameters. More specifically, for a left-right balance parameter a of 64, the reference sound volumes vl, vr are obtained by the above-described expressions (1) and (2). For a left-right balance parameter a smaller than 64, the reference sound volumes vl, vr are obtained by the above-described expressions (3) and (4). For a left-right balance parameter a larger than 64, the reference sound volumes vl, vr are obtained by the above-described expressions (5) and (6).

Thereafter, the front-rear balance parameter b is read from the front-rear balance parameter data (S102), and whether or not the front-rear balance parameter b is 64 is determined (S103). When the front-rear balance parameter b is 64 (S103Y), the sound volume vl1 of the front left speaker 321-1, the sound volume vl2 of the rear left speaker 321-2, the sound volume vr1 of the front right speaker **32*r*-1, and the sound volume vr2 of the rear right speaker 32*r*-2 are determined by the following expressions (7) to (10) (S104**).

$$vl1=vl \tag{7}$$

$$vl2=vl \tag{8}$$

$$vr1=vr \tag{9}$$

$$vr2=vr \tag{10}$$

In this case, the sound volume vl1 of the front left speaker 321-1 becomes equal to the sound volume vl2 of the rear left speaker 321-2, and the sound volume vr1 of the front right speaker **32*r*-1 becomes equal to the sound volume vr2 of the rear right speaker 32*r*-2**.

Meanwhile, when the front-rear balance parameter b is not 64 (S103N), whether or not the value of the front-rear balance parameter b is smaller than 64 is determined (S105). When the value of the front-rear balance parameter b is smaller than 64 (S105Y), the sound volume vl1 of the front left speaker 321-1, the sound volume vl2 of the rear left speaker 321-2, the sound volume vr1 of the front right speaker **32*r*-1, and the sound volume vr2 of the rear right speaker 32*r*-2 are determined by the following expressions (11) to (14) (S106**).

$$vl1=vl \tag{11}$$

$$vl2=vl*(b/64) \tag{12}$$

$$vr1=vr \tag{13}$$

$$vr2=vr*(b/64) \tag{14}$$

In this case, the sound volume vl1 of the front left speaker 321-1 becomes larger than the sound volume vl2 of the rear left speaker 321-2, and the sound volume vr1 of the front right speaker 32r-1 becomes larger than the sound volume vr2 of the rear right speaker 32r-2.

Meanwhile, when the front-rear balance parameter b is not smaller than 64 (S105N), that is, when the front-rear balance parameter b is larger than 64, the sound volume vl1 of the front left speaker 321-1, the sound volume v12 of the rear left speaker 321-2, the sound volume vr1 of the front right speaker 32r-1, and the sound volume vr2 of the rear right speaker 32r-2 are determined by the following expressions (15) to (18) (S107).

$$vl1=vl*((127-b)/64) \tag{15}$$

$$vl2=vl \tag{16}$$

$$vr1=vr*((127-b)/64) \tag{17}$$

$$vr2=vr \tag{18}$$

In this case, the sound volume vl2 of the rear left speaker 321-2 becomes larger than the sound volume vl1 of the front left speaker 321-1, and the sound volume vr2 of the rear right speaker 32r-2 becomes larger than sound volume vr1 of the front right speaker 32r-1.

When the sound volume vl1 of the front left speaker 321-1, the sound volume vl2 of the rear left speaker 321-2, the sound volume vr1 of the front right speaker 32r-1, and the sound volume vr2 of the rear right speaker 32r-2 are determined at S104, S106, or S107, output of the sound data begins at the respective determined sound volumes via the front left speaker 321-1, the rear left speaker 321-2, the front right speaker 32r-1, and the rear right speaker 32r-2 (S108). That is, output of sound data by means of four-channel sound output begins.

As described above, according to the entertainment system 10 in the first embodiment, four-channel sound output can be preferably attained, utilizing the control parameter data (two-channel sound output parameter data) created originally for two-channel sound output. This makes it relatively easy to enjoy a game that was created when only use of a two-channel speaker was expected, that is, a game for which only control parameter data adapted to two-channel sound output has been prepared, using a multi-channel speaker.

It should be noted that the entertainment system 10 may alternatively be formed comprising one or more speakers 32 in addition to the front left speaker 321-1, the front right speaker 32r-1, the rear left speaker 321-2, and the rear right speaker 32r-2, so as to attain, for example, 5.1 channel sound output. Output of game effect, or the like, using two-channel sound output parameter data can even be attained in an entertainment system 10 which is capable of 5.1 channel sound output, for example, where four speakers, namely, the front left speaker 321-1, the front right speaker 32r-1, the rear left speaker 321-2, and the rear right speaker 32r-2, are generally used to express sound phase orientation of game sound effects, or the like.

2. Second Embodiment

As an entertainment system according to a second embodiment of the present invention has a hardware structure similar to that of the entertainment system 10 in the first embodiment, the entertainment system of the second embodiment will be described below with reference to FIGS. 1 and 2.

Figure 8:
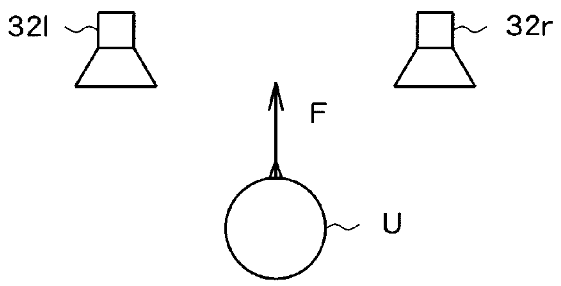
FIG. 8 is a diagram showing one example of layout of the speakers in the second embodiment.

The entertainment system according to the second embodiment differs from the entertainment system 10 of the first embodiment in that the entertainment system of the second embodiment comprises, as shown in FIG. 8, a left speaker 321 installed in front and to the left of the user U and a right speaker 32r installed in front and to the right of the user U, and does not include the speakers 32 installed to the right and left behind the user U. That is, the entertainment system according to the second embodiment differs from that in the first embodiment in that four-channel sound output is restricted. It should be noted that the left speaker 321 and the right speaker 32r may be incorporated in a TV receiver or incorporated in a headphone or an earphone.

In the entertainment system according to the second embodiment, for example, a game program, sound data, such as sound effects, or the like, and control parameter data for outputting the respective sound data by means of four-channel sound output (hereinafter referred to as four-channel sound output parameter data) are read from the optical disc 36 or the hard disk 38, and a game is executed.

It should be noted that four-channel sound output parameter data (control data) is control parameter data which is created based on an assumption that sound data is output via four speakers 32, including the speakers 32 installed to the left and right in front of the user (main speakers), and the speakers 32 installed to the left and right behind the user (sub-speakers).

In the following, a technique for attaining preferable output of sound data via two speakers 32, namely, the left speaker 321 and the right speaker 32r (the main speakers), utilizing four-channel sound output parameter data, will be described. That is, a technique for attaining preferable two-channel sound output, utilizing four-channel sound output parameter data will be described.

Figures 9, 10, 11:
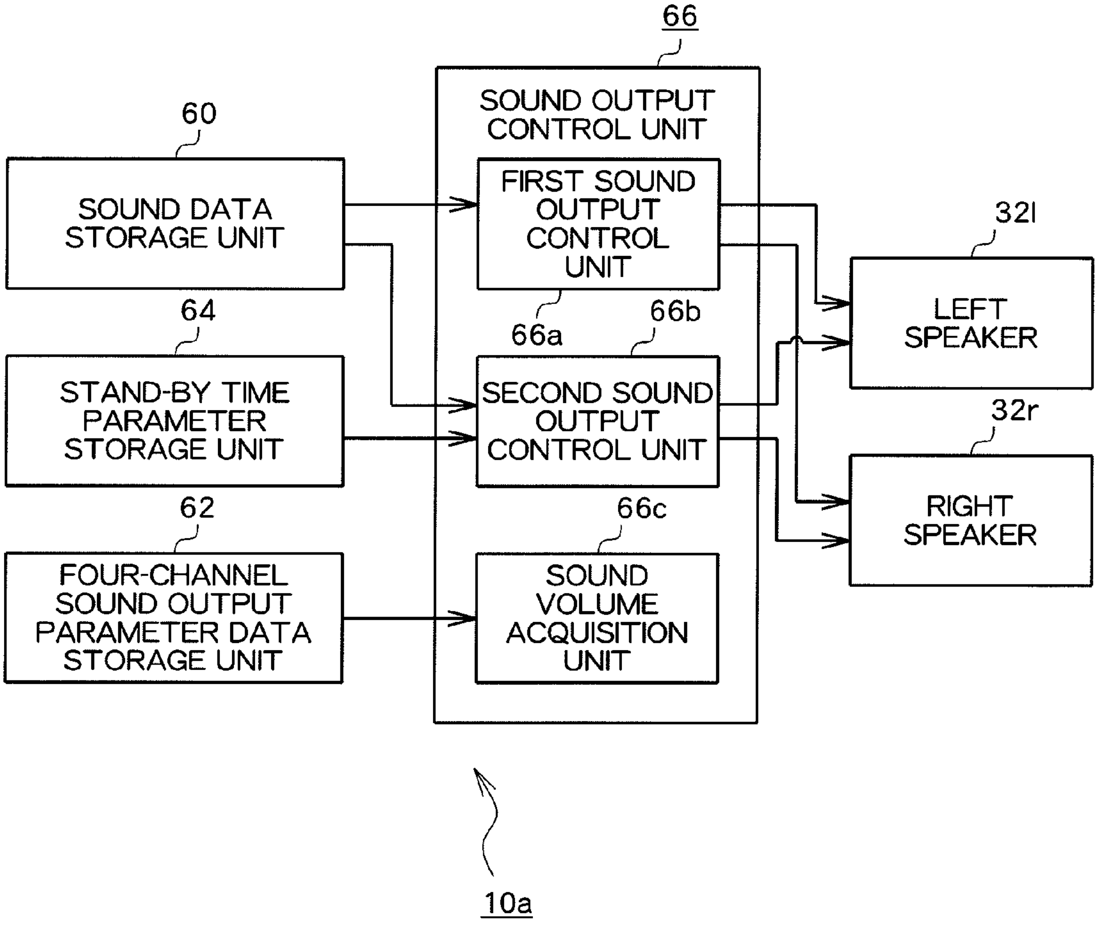
FIG. 9 is a functional block diagram showing an entertainment system according to the second embodiment.
FIG. 10 is a diagram showing one example of four-channel sound output parameter data.
FIG. 11 is a diagram showing one example of a stand-by time parameter.

FIG. 9 is a diagram showing mainly the functional blocks relevant to the present invention among those realized by the entertainment system 10a according to the second embodiment. As shown in FIG. 9, the entertainment system 10a is constructed comprising a sound data storage unit 60, a four-channel sound output parameter data storage unit 62, a stand-by time parameter storage unit 64, and a sound output control unit 66. These functional blocks are realized, for example, by the MPU 11 by executing programs read from the optical disc 36 and/or the hard disk 38 and/or programs supplied from a network via the network interface 44.

[Sound Data Storage Unit]

The sound data storage unit 60 is the same as the sound data storage unit 50 in the first embodiment.

[Four-Channel Sound Output Parameter Data Storage Unit]

The four-channel sound output parameter data storage unit 62 is realized, for example, using the optical disc 36 and/or the hard disk 38. Four-channel sound output parameter data is stored in the four-channel sound output parameter data storage unit 62.

FIG. 10 shows one example of four-channel sound output parameter data. As shown in FIG. 10, the four-channel sound output parameter data includes, for every sound data, a sound volume parameter, a left-right balance parameter, a front-rear balance parameter, and a pitch parameter. It should be noted that the sound volume parameter, the left-right balance parameter, and the pitch parameter are similar to the sound volume parameter, the left-right balance parameter, and the pitch parameter of the two-channel sound output parameter data (see FIG. 5) in the first embodiment. The front-rear balance parameter is similar to the front-rear balance parameter of front-rear balance parameter data (see FIG. 6) in the first embodiment.

In the following, the manner of determining the sound volumes of the speaker 32 installed in front and to the left of the user (a front left speaker), the speaker 32 installed in front and to the right of the user (a front right speaker), the speaker 32 installed behind and to the left of the user (a rear left speaker), and the speaker 32 installed behind and to the right of the user (a rear right speaker) when four-channel sound output is carried out based on the four-channel sound output parameter data will be described.

When four-channel sound output is carried out based on four-channel sound output parameter data, the sound volume vl1 of the front left speaker, the sound volume vr1 of the front right speaker, the sound volume vl2 of the rear left speaker, and the sound volume vr2 of the rear right speaker are determined as follows.

That is, initially, the sound volume parameter v and left-right balance parameter a of the output object sound data are read, and based on these parameters, the reference sound volumes vl of the front left speaker and the rear left speaker, and the reference sound volumes vr of the front right speaker and the rear right speaker, are obtained.

When the left-right balance parameter a is 64, the reference sound volumes vl, vr are obtained by the following expressions (19) and (20).

$$vl=v \quad (19)$$

$$vr=v \quad (20)$$

When the left-right balance parameter a is smaller than 64, the reference sound volumes vl, vr are obtained by the expressions (21) and (22).

$$vl=v \quad (21)$$

$$vr=v*(a/64) \quad (22)$$

When the left-right balance parameter a is larger than 64, the reference sound volumes vl, vr are obtained by the expressions (23) and (24).

$$vl=v*((127-a)/64) \quad (23)$$

$$vr=v \quad (24)$$

Thereafter, the front-rear balance parameter b of the output object sound data is read, and the sound volume vl1 of the front left speaker, the sound volume vr1 of the front right speaker, the sound volume vl2 of the rear left speaker, and the sound volume vr2 of the rear right speaker are obtained based on the front-rear balance parameter b and the reference sound volumes vl, vr.

When the front-rear balance parameter b is 64, the sound volumes vl1, vl2, vr1, vr2 are obtained by the following expressions (25) to (28).

$$vl1=vl \quad (25)$$

$$vl2=vl \quad (26)$$

$$vr1=vr \quad (27)$$

$$vr2=vr \quad (28)$$

When the front-rear balance parameter b is smaller than 64, the sound volumes vl1, vl2, vr1, vr2 are obtained by the following expressions (29) to (32).

$$vl1=vl \quad (29)$$

$$vl2=vl*(b/64) \quad (30)$$

$$vr1=vr \quad (31)$$

$$vr2=vr*(b/64) \quad (32)$$

When the front-rear balance parameter b is larger than 64, the sound volumes vl1, vl2, vr1, vr2 are obtained by the following expressions (33) to (36).

$$vl1=vl*((127-b)/64) \quad (33)$$

$$vl2=vl \quad (34)$$

$$vr1=vr*((127-b)/64) \quad (35)$$

$$vr2=vr \quad (36)$$

When four-channel sound output is carried out based on four-channel sound output parameter data, sound data is output via the respective speakers 32 at the sound volumes determined for the respective speakers 32, as described above.

[Stand-by Time Parameter Storage Unit]

The stand-by time parameter storage unit 64 is realized using, for example, the main memory 20, the optical disc 36, and the hard disk 38. In the stand-by time parameter storage unit 64, a stand-by time parameter indicative of a stand-by time is stored. FIG. 11 is a diagram showing one example of the content stored in the stand-by time parameter storage unit 64. Details of the stand-by time parameter will be described later.

[Sound Output Control Unit]

The sound output control unit 66 is formed using, as main elements, the MPU 11 and the sound processing unit 30. The sound output control unit 66 performs control to output the sound data via the left speaker 321 and the right speaker 32*r*. The sound output control unit 66 comprises a first sound output control unit 66*a*, a second sound output control unit 66*b*, and a sound volume acquisition unit 66*c*.

[First Sound Output Control Unit]

The first sound output control unit 66*a* performs control to output the output object sound data via the left speaker 321 and the right speaker 32*r* upon arrival of a sound output timing.

[Second Sound Output Control Unit]

Upon arrival of a sound output timing, the second sound output control unit 66*b* performs control to output the sound data formed by substantially reversing the phase of the output object sound data via the left speaker 321 and the right speaker 32*r*. In the following, the sound data controlled to be output by the second sound output control unit 66*b* is referred to as "phase reversed output object sound data", while the sound data controlled to be output by the first sound output control unit 66*a* is referred to as "original output object sound data".

The second sound output control unit 66*b* performs control, based at the stand-by time indicated by the stand-by time parameter, such that output of the phase reversed output object sound data is kept in a standby state. More specifically, the second sound output control unit 66*b* monitors whether or not the stand-by time indicated by the stand-by time parameter has passed after output of the original output object sound data under control of the first sound output control unit 66*a* begins. The second sound output control unit 66*b* performs control to begin output of the phase reversed data when it is determined that the stand-by time indicated by the stand-by time parameter has passed.

Figure 12A:
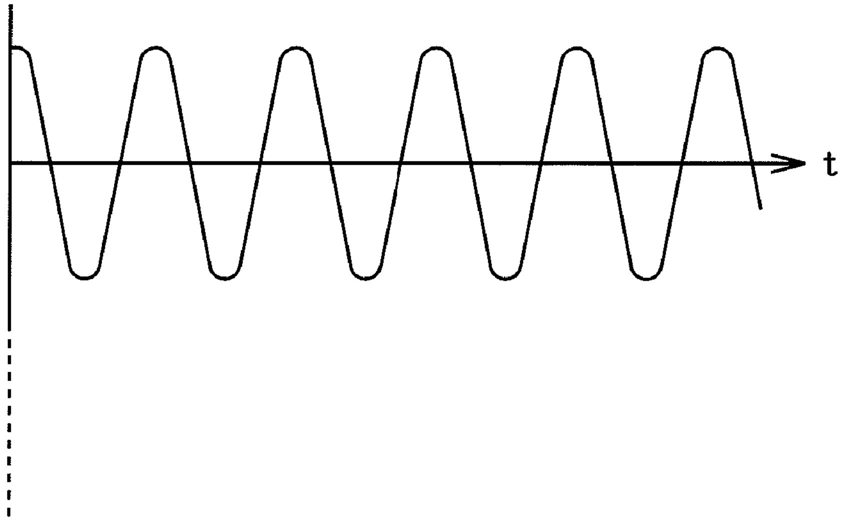
FIGS. 12A and 12B are diagrams showing one example of original data and phase reversed output object sound data.
Figure 12B:
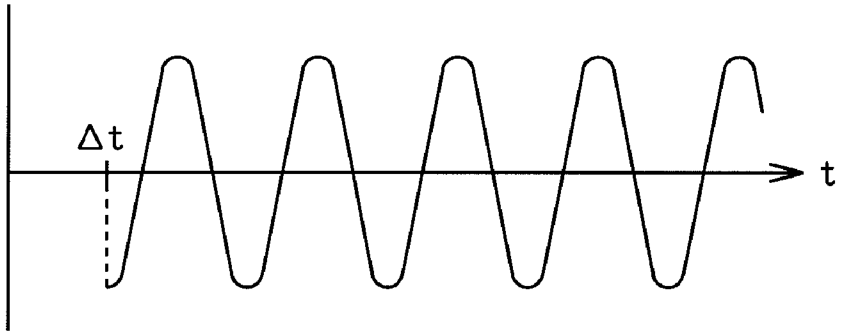

FIGS. 12A and 12B are diagrams showing original data and phase reversed output object sound data to be output via the left speaker 321 and the right speaker 32*r*. In FIGS. 12A and 12B, the lateral axis t is a time axis, and time "0" indicates the sound output timing. FIG. 12A shows one example of original output object sound data to be output via the left speaker 321 and the right speaker 32*r*. FIG. 12B shows one example of phase reversed output object sound data to be output via the left speaker 321 and the right speaker 32*r*. In FIG. 12B, Δt represents a stand-by time indicated by the stand-by time parameter. As shown in FIGS. 12A and 12B, upon arrival of the sound output timing, output of the original output object sound data begins. Thereafter, after elapse of the stand-by time Δt after output of the original output object sound data begins, output of the phase reversed output object sound data begins. In the above, sound which is formed by combining the original output object sound data and the phase reversed output object sound data is output via the left speaker 321 and the right speaker 32*r*.

[Sound Volume Acquisition Unit]

The sound volume acquisition unit 66*c* (acquisition means) obtains the sound volume (main control information) of the left speaker 321 and the right speaker 32*r* when outputting the original output object sound data, and the sound volume (sub-control information) of the left speaker 321 and the right speaker 32*r* when outputting the phase reversed data. These sound volumes are obtained based on four-channel sound output parameter data.

Figure 13:
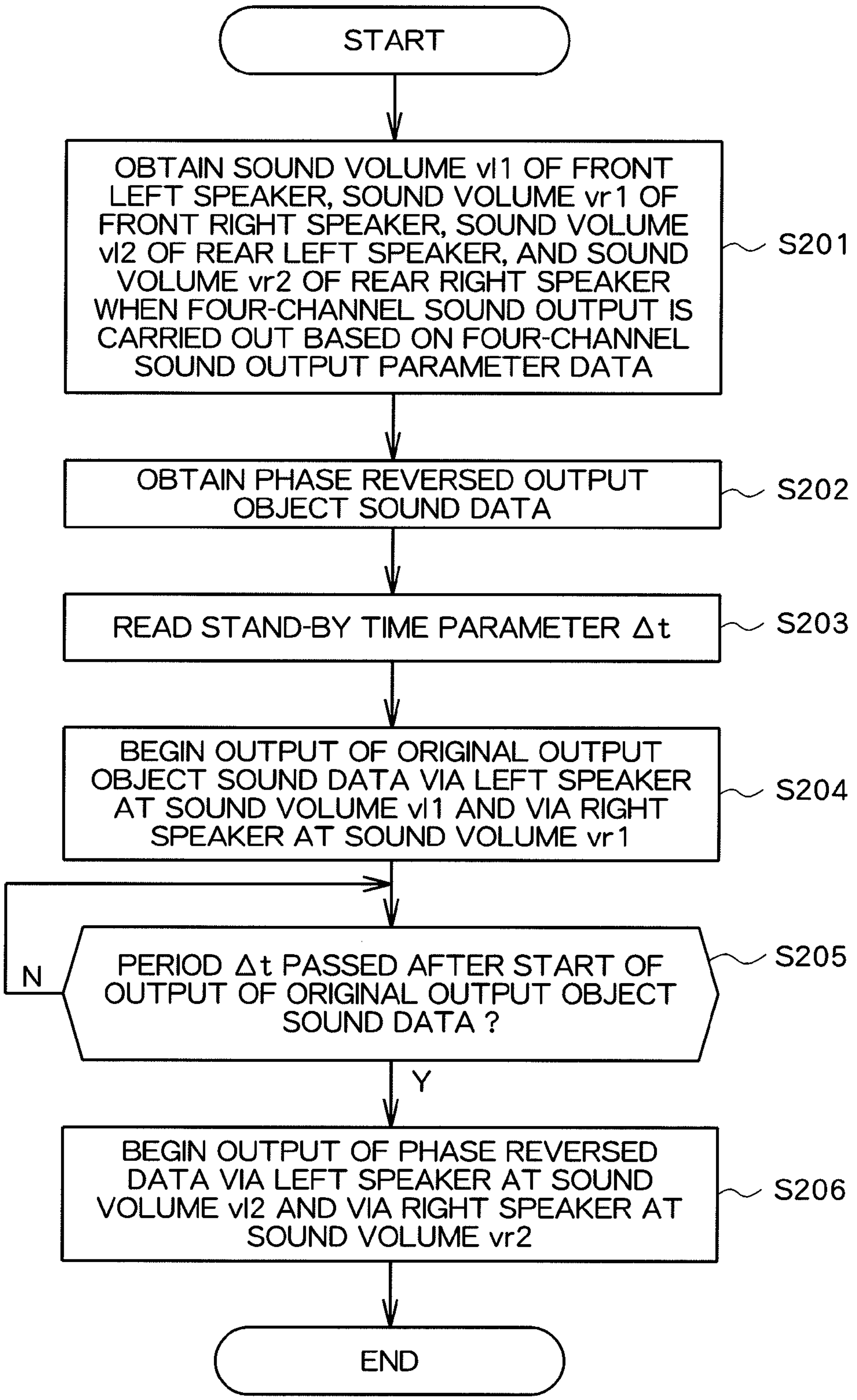
FIG. 13 is a flowchart of a process to be carried out by the entertainment system.

Here, a process to be carried out by the entertainment system 10*a* will be described. FIG. 13 shows a flowchart mainly concerning the process relating to the present invention among those to be carried out when output of sound data begins upon arrival of a sound output timing. The sound output control unit 66 is realized by the MPU 11 by executing a program to carry out this process.

As shown in FIG. 13, initially, the sound volume vl1 of the front left speaker, the sound volume vr1 of the front right speaker, the sound volume vl2 of the rear left speaker, and the sound volume vr2 of the rear right speaker are obtained when output object sound data is output by means of four-channel sound output based on the four-channel sound output parameter data (S201).

At this step, the reference sound volumes vl of the front left speaker and the rear left speaker and the reference sound volumes vr of the front right speaker and the rear right speaker are initially obtained by the above-described expressions (19) to (24). Then, the sound volume vl1 of the front left speaker, the sound volume vr1 of the front right speaker, the sound volume vl2 of the rear left speaker, and the sound volume vr2 of the rear right speaker are obtained by the above-described expressions (25) to (36).

Thereafter, the phase reversed output object sound data is obtained (S202). In addition, the stand-by time parameter Δt is read (S203).

Then, output of the original output object sound data begins via the left speaker 321 at the sound volume vl1, and also via the right speaker 32*r* at the sound volume vr1 (S204).

Thereafter, whether or not a period of time Δt has passed after output of the original output object sound data begins is monitored (S205). When the period Δt has passed after the output of the original output object sound data begins (S205Y), output of the phase reversed data obtained at S202 begins via the left speaker 321 at the sound volume vl2, and also via the right speaker 32*r* at the sound volume vr2 (S206). In the above, sound which is formed by combining the original data and phase reversed output object sound data at a sound volume ratio vl1:vl2 is output via the left speaker 321, and sound which is formed by combining the original data and phase reversed output object sound data at a sound volume ratio vr1:vr2 is output via the right speaker 32*r*.

As described above, in the entertainment system 10*a* according to the second embodiment, phase reversed output object sound data is output via the left speaker 321 and the right speaker 32*r*. The sound volume at which to output the phase reversed data via the left speaker 321 is equal to the sound volume of the rear left speaker which is assumed to be installed. Also, the sound volume at which to output the phase reversed data via the right speaker 32*r* is equal to the sound volume of the rear right speaker which is assumed to be installed.

In the case where the phase reversed output object sound data is output via the speaker 32 installed in front of the user, the user will hear the sound as if the original output object sound data were output from behind them. That is, it is possible to cause the user to have the illusion that the speaker 32 were installed behind them even though no speaker 32 is actually installed behind them. Therefore, it is possible to cause the user to have the illusion that four-channel sound output is being carried out when two-channel sound output is actually carried out.

As described above, according to the entertainment system 10*a* in the second embodiment, two-channel sound output of sound data is preferably carried out based on four-channel sound output parameter data. According to the entertainment system 10*a* in the second embodiment, not only four-channel sound output but also two-channel sound output is preferably carried out based on four-channel sound output parameter data. Therefore, the game sound creator, or the like, is required to create only four-channel sound output parameter data. In other words, creation of two-channel sound output parameter data, separately from four-channel sound output parameter data, is no longer necessary, so that the burden imposed on the game sound creator, or the like, is accordingly reduced.

Here, suppose that outputs of the original output object sound data and the phase reversed output object sound data begin at the same time. In this case, there is the possibility of a problem in that the original output object sound data and the phase reversed data of the same are offset from each other, so that no sound is output via the left speaker 321 and the right speaker 32*r*. As described above, sound which is formed by combining the original output object sound data and the phase reversed output object sound data at the sound volume ratio vl1:vl2 is output via the left speaker 321, while sound which is formed by combining the original output object sound data and the phase reversed data at the sound volume ratio vr1:vr2 is output via the right speaker 32*r*. Therefore, particularly in the case where the value of the front-rear balance parameter is 64 or a value close thereto (that is, vl1 is substantially equal to vl2, and vr1 is substantially equal to vr2), the above-described deficiency is likely to be caused. Regarding this point, the likelihood of occurrence of the above-described deficiency can be reduced in the entertainment system 10*a* in the second embodiment as output of the phase reversed output object data begins after elapse of a stand-by time after output of the original data begins.

In order to suppress the occurrence of the above-described deficiency, alternatively, output of the original output object sound data may begin after output of the phase reversed output object sound data begins. However, an arrangement in which output of the original output object sound data begins first, followed by output of the phase reversed data, as in this embodiment, makes it possible to more preferably cause the user to have the illusion that speakers are installed behind since recognition by a person of sound generated behind them is generally delayed compared to sound generated in front.

Here, the stand-by time will be described in detail.

Figure 14:
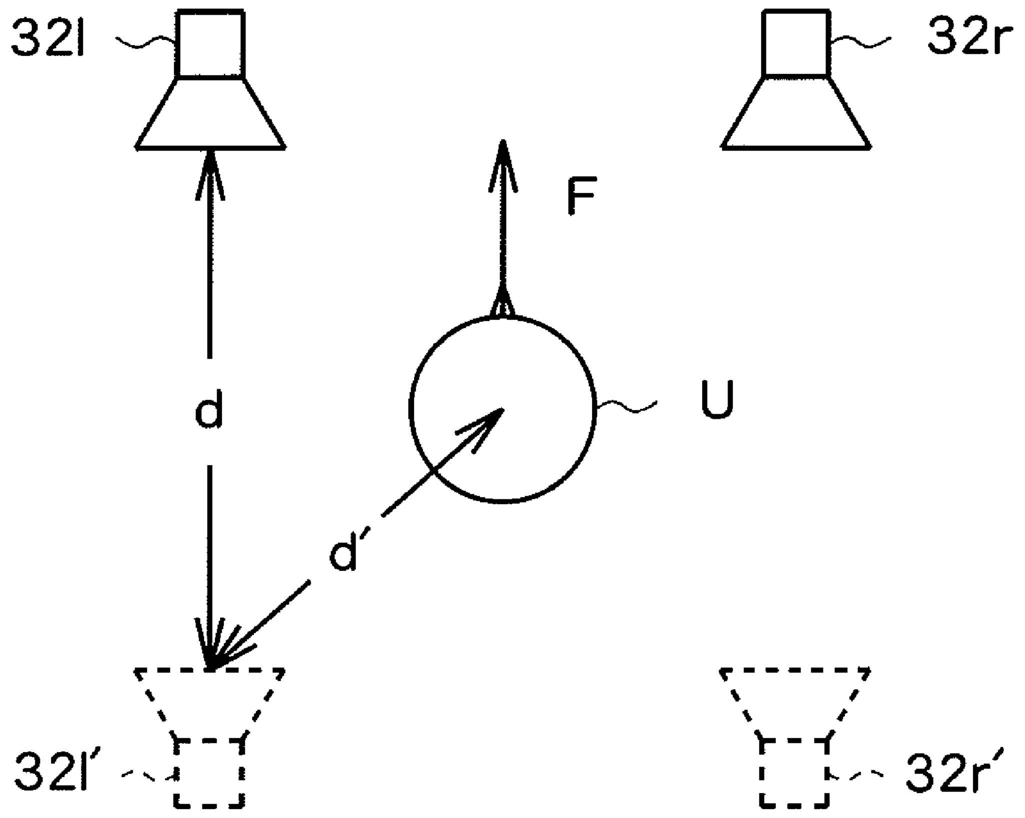
FIG. 14 is a diagram explaining an estimated distance.

The stand-by time can be preferably determined based on an estimated distance d between the left speaker 321 and the rear left speaker 32*l*' (or, between the right speaker 32*r* and the rear right speaker 32*r*') based on the assumption that the rear left speaker 32*l*' and the rear right speaker 32*r*' are provided in addition to the left speaker 321 and the right speaker 32*r*, as shown in FIG. 14. More specifically, a time obtained by dividing the estimated distance d by the sound transmission speed sv, as expressed by the following expression (37), may be preferably determined as the stand-by time Δt. As the sound transmission speed is about 340 m/s, when the estimated distance d is 3 m, for example, the stand-by time Δt is preferably determined as about 0.009 seconds.

$$\Delta t = d/sv \quad (37)$$

When the stand-by time is determined as described above, it is possible to cause the user U to have the illusion that the sound data output from the rear left speaker 32*l*' and the rear right speaker 32*r*', both located behind the user, has been reflected by the left speaker 32*l* and the right speaker 32*r* located in front of the user U and then reaches the user U's ears.

It should be noted that the stand-by time may be determined using any other methods. For example, the stand-by time may be determined based on an estimated distance d' between the user U and the rear left speaker 32*l*' (or the rear right speaker 32*r*'), as shown in FIG. 14, based on the assumption that four-channel sound output is applied.

Alternatively, the game sound creator, the programmer, or the user may designate the stand-by time. By encouraging the user to designate the stand-by time, the user can designate the stand-by time in consideration of the estimated distance d which will result from four speakers 32 being arranged in their own room. When the user is encouraged to designate the stand-by time, the user may input either the stand-by time itself or the estimated distance d. When input of the estimated distance d is accepted, the stand-by time can be obtained using the above-described expression (37) based on the estimated distance d input by the user.

It should be noted that the present invention is not limited to the above described embodiment.

For example, the present invention can be applied to situations other than sound output in a game, including, for example, a sound output device other than the entertainment system 10.

What is claimed is:

1. A sound output device, comprising:

control data storage for storing control data for outputting sound data from one or more main speakers and one or more sub-speakers;

acquisition means for acquiring main control information corresponding to the main speaker and sub-control information corresponding to the sub-speaker based on the control data;

first sound output control means for outputting object sound data from a speaker serving as the main speaker based on the main control information in response to arrival of a sound output timing; and second sound output control means for outputting sound data formed by substantially inverting a phase of the object sound data from the speaker serving as the main speaker based on the sub-control information in response to arrival of the sound output timing.

2. The sound output device according to claim 1, wherein the control data includes sound volume balance data concerning output sound volume balance between the main speaker and the sub-speaker, the acquisition means acquires an output sound volume corresponding to the main speaker and an output sound volume corresponding to the sub-speaker based on the sound volume balance data, the first sound output control means outputs the object sound data from the speaker serving as the main speaker at the output sound volume corresponding to the main speaker, and the second sound output control means outputs the sound data formed by substantially inverting, the phase of the object sound data from the speaker serving as the main speaker at the output sound volume corresponding to the sub-speaker.

3. The sound output device according to claim 1 or claim 2, wherein a timing at which to begin output of the sound data formed by substantially inverting the phase of the object sound data is defined different from a timing at which to begin output of the object sound data.

4. The sound output device according to claim 3, further comprising:

stand-by time storage for storing a stand-by time, wherein the second sound output control means includes acquisition means for acquiring the sound data formed by substantially inverting the phase of the object sound data; and stand-by means for holding in a stand-by state output of the sound data that is formed by substantially inverting the phase of the object sound data and is acquired by the acquisition means based on the stand-by time stored in the stand-by time storage.

5. The sound output device according to claim 4, wherein the stand-by means includes:

means for monitoring whether or not the stand-by time stored in the stand-by time storage elapses after output of the object sound data by the first sound output control means begins; and means for beginning output of the sound data that is formed by substantially inverting the phase of the object sound data and is acquired by the acquisition means, when the stand-by time stored in the stand-by time storage elapses after the output of the object sound data by the first sound output control means begins.

6. The sound output device according to claim 4, wherein the stand-by time is determined based on a distance between the speaker serving as the main speaker and the speaker serving as the sub-speaker based on an assumption that the speaker serving as the main speaker and the speaker serving as the sub-speaker are set.

7. The sound output device according to claim 4, further comprising:

means for guiding a user to set the stand-by time, wherein the stand-by time storage stores the stand-by time set by the user.

8. A control method for a sound output device, comprising:

a control data reading step of reading, from control data storage for storing control data for outputting sound data from one or more main speakers and one or more sub-speakers, the control data;

an acquisition step of acquiring main control information corresponding to the main speaker and sub-control information corresponding to the sub-speaker based on the control data;

a first sound output control step of outputting object sound data from a speaker serving as the main speaker based on the main control information in response to arrival of a sound output timing; and a second sound output control step of outputting sound data formed by substantially inverting a phase of the object sound data from a speaker serving as the main speaker based on the sub-control information in response to arrival of the sound output timing.

9. A computer readable information storage medium storing a program for causing a computer to function as:

control data reading means for reading, from control data storage for storing control data for outputting sound data from one or more main speakers and one or more sub-speakers, the control data;

acquisition means for acquiring main control information corresponding to the main speaker and sub-control information corresponding to the sub-speaker based on the control data;

first sound output control means for outputting object sound data from a speaker serving as the main speaker based on the main control information in response to arrival of a sound output timing; and second sound output control means for outputting sound data formed by substantially inverting a phase of the object sound data from a speaker serving as the main speaker based on the sub-control information in response to arrival of the sound output timing.

10. A sound output device, comprising:

control data storage for storing control data for outputting sound data from one or more main speakers and one or more sub-speakers;

an acquisition unit for acquiring main control information corresponding to the main speaker and sub-control information corresponding to the sub-speaker based on the control data;

a first sound output controller for outputting object sound data from a speaker serving as the main speaker based on the main control information in response to arrival of a sound output timing; and a second sound output controller for outputting sound data formed by substantially inverting a phase of the object sound data from the speaker serving as the main speaker based on the sub-control information in response to arrival of the sound output timing.

11. The sound output device according to claim 10, wherein the control data includes sound volume balance data concerning output sound volume balance between the main speaker and the sub-speaker, the acquisition unit acquires an output sound volume corresponding to the main speaker and an output sound volume corresponding to the sub-speaker based on the sound volume balance data, the first sound output controller outputs the object sound data from the speaker serving as the main speaker at the output sound volume corresponding to the main speaker, and the second sound output controller outputs the sound data formed by substantially inverting the phase of the object sound data from the speaker serving as the main speaker at the output sound volume corresponding to the sub-speaker.

12. The sound output device according to claim 10, wherein a timing at which to begin output of the sound data formed by substantially inverting the phase of the object sound data is defined different from a timing at which to begin output of the object sound data.

13. The sound output device according to claim 12, further comprising:

stand-by time storage for storing a stand-by time, wherein the second sound output controller:

acquires the sound data formed by substantially inverting the phase of the object sound data; and holds in a stand-by state output of the acquired sound data that is formed by substantially inverting the phase of the object sound data based on the stand-by time stored in the stand-by time storage.

14. The sound output device according to claim 13, wherein the second sound output controller:

monitors whether or not the stand-by time stored in the stand-by time storage elapses after output of the object sound data by the first sound output controller begins; and begins output of the sound data that is formed by substantially inverting the phase of the object sound data when the stand-by time stored in the stand-by time storage elapses after the output of the object sound data by the first sound output controller begins.

15. The sound output device according to claim 13, wherein the stand-by time is determined based on a distance between the speaker serving as the main speaker and the speaker serving as the sub-speaker based on an assumption that the speaker serving as the main speaker and the speaker serving as the sub-speaker are set.

16. The sound output device according to claim 13, wherein the stand-by time is set by the user.

17. A computer readable information storage medium storing a program for causing a computer to function as:

a control data reader for reading, from control data storage for storing control data for outputting sound data from one or more main speakers and one or more sub-speakers, the control data;

an acquisition unit for acquiring main control information corresponding to the main speaker and sub-control information corresponding to the sub-speaker based on the control data;

a first sound output controller for outputting object sound data from a speaker serving as the main speaker based on the main control information in response to arrival of a sound output timing; and a second sound output controller for outputting sound data formed by substantially inverting a phase of the object sound data from a speaker serving as the main speaker based on the sub-control information in response to arrival of the sound output timing.

* * * * *